United States Patent
Adamson et al.

(10) Patent No.: US 9,545,785 B2
(45) Date of Patent: Jan. 17, 2017

(54) METHOD OF PRINTING USING A REIMAGEABLE PRINTING PLATE WITH AN ALUMINUM OXIDE SURFACE

(75) Inventors: John David Adamson, Cumbria (GB); Peter Andrew Reath Bennett, West Yorkshire (GB); Richard Arthur Hutchinson, North Yorkshire (GB); Rodney Martin Potts, West Yorkshire (GB)

(73) Assignee: J P Imaging Limited, Birkenhead Cheshire (GB)

( * ) Notice: Subject to any disclaimer, the term of this patent is extended or adjusted under 35 U.S.C. 154(b) by 1512 days.

(21) Appl. No.: 13/063,466

(22) PCT Filed: Sep. 7, 2009

(86) PCT No.: PCT/GB2009/051132
§ 371 (c)(1),
(2), (4) Date: Apr. 6, 2011

(87) PCT Pub. No.: WO2010/029342
PCT Pub. Date: Mar. 18, 2010

(65) Prior Publication Data
US 2012/0132092 A1    May 31, 2012

(30) Foreign Application Priority Data

Sep. 12, 2008 (GB) .................................. 0816697.7
Jun. 23, 2009 (GB) .................................. 0910791.3

(51) Int. Cl.
*B41C 1/10* (2006.01)
*B41M 1/06* (2006.01)
(Continued)

(52) U.S. Cl.
CPC .............. *B41C 1/1041* (2013.01); *B41M 1/06* (2013.01); *B41N 1/006* (2013.01); *G03F 7/0043* (2013.01);
(Continued)

(58) Field of Classification Search
None
See application file for complete search history.

(56) References Cited

U.S. PATENT DOCUMENTS 4,081,572 A   3/1978   Pacansky
4,833,990 A   5/1989   Hirt et al.
(Continued)

FOREIGN PATENT DOCUMENTS

DE   10021041 A1   11/2001
DE   10058990 A1   7/2002
(Continued)

OTHER PUBLICATIONS

Phase Transformation at the surface of TiO2 single crystal irradiated by femtosecond laser pulse, Yang et al., Appl. Phys. A 88, 801-804 (2007).*
(Continued)

*Primary Examiner* — Joshua D Zimmerman
(74) *Attorney, Agent, or Firm* — Hoffman Warnick LLC

(57) ABSTRACT

A printing form precursor comprises a printing surface which comprises an inorganic metal compound, the printing surface being hydrophobic and capable of being made hydrophilic by energy but capable of becoming hydrophobic again, for reuse, if desired. An associated method of printing includes steps of subjecting the printing surface imagewise to energy so as to locally increase its hydrophilicity sufficient to make the surface differentiated in its acceptance of an oleophilic a printing ink; applying the ink to the printing surface and printing from the printing surface; causing or
(Continued)

Figure 1:
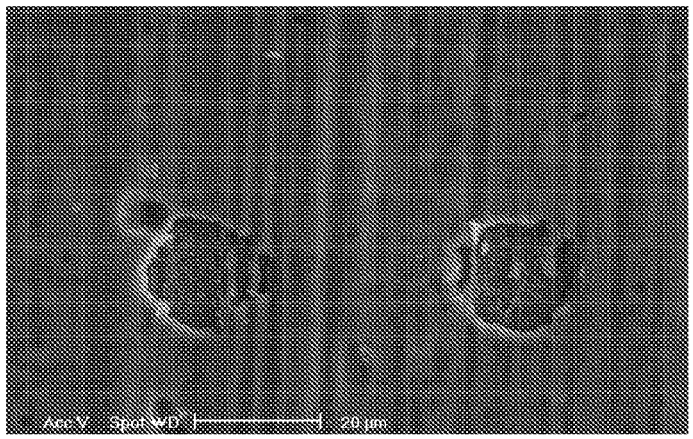

allowing the printing surface to undergo a reduction in hydrophilicity sufficient again to make the printing surface uniform in its acceptance of a printing ink; and, if wished, repeating these steps on multiple occasions. Thus the invention achieves the goal of providing a printing form precursor which does not need a chemical developer, and which can be used multiple times, to print different images.

18 Claims, 2 Drawing Sheets

(51) Int. Cl.
*B41N 1/00* (2006.01)
*G03F 7/004* (2006.01)
*H05K 3/12* (2006.01)
*H05K 3/38* (2006.01)

(52) U.S. Cl.
CPC .............. *H05K 3/1275* (2013.01); *H05K 3/385* (2013.01); *H05K 2203/0315* (2013.01)

(56) References Cited

U.S. PATENT DOCUMENTS

| | | |
|---|---|---|
| 5,454,318 A | 10/1995 | Hirt et al. |
| 5,543,269 A | 8/1996 | Chatterjee et al. |
| 5,555,809 A | 9/1996 | Hirt et al. |
| 5,650,258 A | 7/1997 | Doyle et al. |
| 5,743,188 A | 4/1998 | Ghosh et al. |
| 5,816,161 A | 10/1998 | Nussel et al. |
| 5,836,248 A | 11/1998 | Jarrold et al. |
| 5,836,249 A | 11/1998 | Chatterjee et al. |
| 5,839,369 A | 11/1998 | Chatterjee et al. |
| 5,839,370 A | 11/1998 | Chatterjee et al. |
| 5,843,599 A | 12/1998 | Paz-Pujalt et al. |
| 5,855,173 A | 1/1999 | Chatterjee et al. |
| 5,870,956 A | 2/1999 | Ghosh et al. |
| 5,881,645 A | 3/1999 | Lenney et al. |
| 5,893,328 A | 4/1999 | Ghosh et al. |
| 5,925,496 A | 7/1999 | Ghosh et al. |
| 5,927,207 A | 7/1999 | Ghosh et al. |
| 6,016,750 A | 1/2000 | Nussel et al. |
| 6,082,263 A | 7/2000 | Koguchi et al. |
| 6,105,500 A | 8/2000 | Bhambra et al. |
| 6,125,756 A | 10/2000 | Nussel et al. |
| 6,423,467 B1 | 7/2002 | Kawauchi et al. |
| 6,423,468 B1 | 7/2002 | Hotta et al. |
| 6,482,570 B1 | 11/2002 | Hotta |
| 6,632,584 B1 | 10/2003 | Morgan |
| 6,762,787 B2 | 7/2004 | Beier |
| 6,851,366 B2 | 2/2005 | Gutfleisch et al. |
| 7,157,210 B2 | 1/2007 | Harada et al. |
| 7,259,774 B2 | 8/2007 | Beier |
| 2002/0003569 A1 | 1/2002 | Beier |
| 2002/0030733 A1 | 3/2002 | Ressel et al. |
| 2003/0145749 A1 | 8/2003 | Van de Leest |
| 2004/0244620 A1 | 12/2004 | Harada et al. |
| 2005/0287693 A1 | 12/2005 | Ressel et al. |
| 2006/0096473 A1 | 5/2006 | Beisswenger et al. |
| 2006/0201360 A1 | 9/2006 | Andriessen et al. |
| 2006/0238602 A1 | 10/2006 | Fischer |

FOREIGN PATENT DOCUMENTS

| | | |
|---|---|---|
| DE | 10215052 A1 | 10/2002 |
| DE | 10134150 A1 | 1/2003 |
| DE | 10227054 A1 | 12/2003 |
| EP | 0652483 A1 | 5/1995 |
| EP | 0872339 A1 | 10/1998 |
| EP | 0875395 A1 | 11/1998 |
| EP | 1270216 A1 | 1/2003 |
| EP | 1321309 A2 | 6/2003 |
| EP | 1375136 A1 | 1/2004 |
| EP | 1703321 A1 | 9/2006 |
| JP | 2002207199 | 7/2002 |
| JP | 2002337303 | 11/2002 |
| JP | 2004249475 | 9/2004 |
| JP | 2004262189 | 9/2004 |
| WO | 9852769 A1 | 11/1998 |
| WO | 2009059826 A1 | 5/2009 |
| WO | 2010017068 A2 | 2/2010 |

OTHER PUBLICATIONS

Ansari et al., Modification of Aluminium Surface Using Picosecond Laser for Printing Applications (presented at MRS Fall Conference on Dec. 2, 2009).*

Patent Cooperation Treaty, PCT International Search Report and Written Opinion of the International Searching Authority for Application No. PCT/GB2009/051131 dated Mar. 25, 2010, 12 pages.

Patent Cooperation Treaty, PCT International Search Report and Written Opinion of the International Searching Authority for Application No. PCT/GB2009/051132 dated Dec. 29, 2009, 9 pages.

Zimmerman, Office Action Communication for U.S. Appl. No. 13/063,465 dated Dec. 20, 2013, 16 pages.

Final Office Action for U.S. Appl. No. 13/063,465, dated Aug. 18, 2014, 10 pages.

Kautek et al., "Physico-chemical aspects of femtosecond-pulse-laser-induced surface nanostructures," Appl Phys. A 81:65-70 (2005).

Zimmerman, Joshua D. Office Action Communication for U.S. Appl. No. 13/063,465, dated Jan. 20, 2015, 10 pages.

* cited by examiner

Anodised only aluminium oxide/aluminium (no PAT)
2 x 5µJ pulses
SEM Accelerating voltage 20.0kV Anodised only aluminium oxide/aluminium (no PAT)
2 x 4µJ pulses
SEM Accelerating voltage 15.0kV

METHOD OF PRINTING USING A REIMAGEABLE PRINTING PLATE WITH AN ALUMINUM OXIDE SURFACE

This invention relates to improvements in printing, and in particular to lithographic printing forms having new capabilities, and to the use of such printing forms in lithographic printing.

Fundamentally, all lithographic printing processes take a printing form precursor which has a specially prepared surface which is uniform throughout; and modifies selected regions of it, leaving reciprocal regions unmodified. Many processes subject the printing form precursor to a chemical developer which acts upon either the modified or unmodified regions, to produce the differentiation needed for printing. Optionally the developed surface is treated to harden the remaining areas of the coating, for example by baking, prior to printing.

It should be noted that in this specification we use the term 'printing form precursor' to denote the initial article having a uniform surface, undifferentiated as regards the acceptance or rejection of ink; and 'printing form' to denote the article now with a differentiated surface which can be printed from. The term printing form herein may be substituted by the term printing plate. The term printing form is preferred in describing and defining the invention because it is of broad connotation. The term printing plate or just plate may nevertheless be used herein for ease of reading.

Printing form precursors having thereon a coating of a chemical composition may be altered in their propensity to be dissolved in a developer solution, by suitable energy. With some compositions the energy renders the areas of the coating subjected to the energy more soluble in the developer. Because of the solubility differential resulting from the imagewise application of energy, on contact with the developer the imaged areas are dissolved away leaving non-imaged areas where the coating remains. Such systems are called positive working systems. The remaining areas of coating are generally oxophilic, and ink-accepting. In the dissolved-away areas the substrate is exposed, and is generally hydrophilic and able to accept the water component of the ink/water fount solution. Thus, printing may be carried out.

In alternative systems it is the areas which have been imagewise subjected to energy which are rendered less soluble than the imaged areas, so that it is the non-imaged areas in which the coating is dissolved away. Such systems are called negative working systems.

With traditional technology a printing plate is used for one image and is then discarded, or recycled. The printing industry is a vast industry and the environmental implications of the current approach of using a printing plate and scrapping it, or even using it and recovering the substrates, such as a metal, for re-use, still at a heavy environmental cost, are enormous.

These existing processes also have a heavy requirement for chemicals. There is the imaginable coating itself, which generally comprises a polymer and an imaging chemistry, co-deposited from a solvent, the latter having to be removed by evaporation. There is the developer solution. The solvent and the developer solution must be disposed of or worked up for re-use. There are the chemicals needed for clean-up, recycling or disposal of the solvent and developer solution.

There have been attempts to develop so-called process less lithographic systems i.e. Not requiring a developer solution. In such systems printing forms are imagewise exposed to suitable energy, causing a transition in the imaged areas, without there being a development step leading to areas of residual coating and reciprocal areas of exposed substrate, the former standing as 'islands' in the latter.

The earliest and so far most widely used "process less" technology, is thermal ablation. Here a powerful thermal laser blasts away the coating from the non-image areas of the plate leaving behind an oxophilic surface denoting the image. Ablation, however, requires special equipment to deal with the debris.

So-called 'switch able' process less systems have been proposed. The aim is to 'switch' the coating from hydrophilic to hydrophobic (or vice versa). However nothing has been successfully commercialized so far, and there are technical issues around the production and imaging of the plates.

In a more advanced form of this concept, 'switch able' surfaces have also been suggested where the 'switching' could, in fact, be reversed.

In U.S. Pat. No. 5,743,188 there is described the use of a lithographic plate which has a zirconia ($ZrO_2$) ceramic surface. Exposure to radiation transforms the surface from hydrophilic to oxophilic or from oxophilic to hydrophilic (dependent upon the circumstances). The zirconia ceramic plate is said to be capable of long runs and can be re-used by erasing the image from the ceramic surface by thermally activated oxidation or by laser assisted oxidation. Follow-up patent U.S. Pat. No. 5,855,173 describes ceramics which are alloys of $ZrO_2$ and a second oxide chosen from MgO, CaO, $Y_2O_3$ and $Sc_2O_3$.

In US2003/0145749 a reversible method for producing a printing form is described. According to this patent application, oxygen vacancies are introduced into a ceramic oxide or oxidic ceramic (such as alumina, zirconia or anodised aluminium—preferred oalumina) by either exposure to UV radiation between 200 and 400 nm or by heating under low partial oxygen pressure or in a reducing atmosphere. These steps require impractical conditions of exposure in terms of at least one of time, temperature and atmosphere.

EP 1,375,136 describes the concept of a reusable printing form which comprises a printing area having a metal oxide surface which is coated with an amphiphilic organic compound having an acidic polar character. By appropriate application of energy, the surface can be imaged, erased and re-used.

Despite intensive R&D efforts from both the plate manufacturers and the printing press manufacturers, none of these inventions has been reduced to practice; practical operation may be inadequate, and/or exposure times and/or energies and/or temperatures may be too extreme to be commercially viable.

A process less printing system which could modify a printing surface non-catastrophically, and switch it in a reversible manner between states of ink-acceptance and ink-repellence, would in our view be of high value. However a commercial, re-usable, process less, printing form precursor is not available, to the best of our knowledge.

It is an object of the present invention to provide a printing form precursor which, at least in preferred embodiments, does not require development and is re-usable; and a method for printing, using same.

In accordance with a first aspect of the present invention there is provided a method of printing comprising:
  a) providing a printing form precursor having a printing surface which comprises an inorganic metal compound, uncoated by a developable image layer and uniform in its acceptance of an oxophilic printing ink;

b) subjecting the printing surface imagewise to energy so as to increase the hydrophilicity of the printing surface, where subjected to energy, sufficient to make the surface differentiated in its acceptance and non-acceptance of the ink; and c) applying the ink to the printing surface and printing from the printing surface. Step c) may be followed by:

d) causing or allowing the printing surface to undergo a reduction in hydrophilicity sufficient again to make the printing surface uniform in its acceptance of a printing ink, and e) repeating at least steps b) and c).

In accordance with a second aspect of the present invention there is provided a printing form precursor comprising a printing surface which comprises an inorganic metal compound, the printing surface being hydrophobic and capable of being made hydrophilic by energy but capable of becoming hydrophobic again, for re-use, if desired.

The definitions of preferred features and aspects apply equally to the first and second aspects unless it is stated otherwise.

The skilled person will understand what is meant by the term "hydrophilic" and "hydrophobic", and their derivative forms, used herein. These may be regarded as relative terms and that the essential point is that there may be a change, for imaging, so that the printing surface becomes more hydrophilic, and the reversion step in which the printing surface becomes more hydrophobic; in any event, in this invention, a degree sufficient to show, for a phase of operation, a differentially ink-accepting characteristic. For practical purposes, in this field, in which greasy inks are customarily used, "hydrophilic" may be regarded as having the same meaning as "oleophobic"; and "hydrophobic" may be regarded as having the same meaning as "oxophilic". The respective terms may be substituted for each other.

In an extremely simple way these terms can be considered in relation to droplets of water on the printing surface. When a surface is suitably hydrophobic for the purposes of the present invention, i.e. before the image-forming step b), the droplets form beads, upstanding in appearance, and of small contact area with the surface. Preferably these bead-like droplets have a contact angle with the printing surface of 45° or more, preferably 50° or more, preferably 55° or more, preferably 60° or more; and most preferably 65° or more When the surface is suitably hydrophilic for the purposes of the present invention, i.e. in regions following the image-forming step b), the contact area is larger, and water more extensively wets the surface. Preferably these droplets have a contact angle with the printing surface of 35° or less, preferably of 30° or less, and most preferably of 25° or less.

It has been found in the present invention that inorganic metal compounds, for example oxide-coated substrates, imaged in accordance with the present invention, experience a decrease in their contact angle.

The substrate may be grained; that is, given a chemical treatment with a solution, such as mineral acid, to develop the topography of the printing surface. However graining is not a necessary part of the present invention, and there may be useful embodiments which have not undergone graining.

The metal compound may suitably be a metal sulphide or, preferably, a metal oxide.

The metal may suitably be a metal having an atomic number from 12 to 83 inclusive, preferably 12 to 74 inclusive, preferably 12 to 48 inclusive, and preferably from 13 to 30 inclusive.

The metal may suitably be selected from Group Nos. 3 to 13 of the periodic table. More preferably it may be aluminium or a transition metal selected from the first row of transition metals in the periodic table (i.e. atomic numbers 21 to 30 inclusive).

Preferred metals satisfy definitions of both of the preceding paragraphs.

The metal compound may be a layer which forms naturally on a metal substrate under ambient conditions; for example an oxide layer on aluminium, titanium, chromium, copper, zinc, stainless steel or brass, or a silver sulphide layer on silver. Alternatively or additionally it may be provided, or built up, by a preparatory step of anodising, for example electrochemically anodising, or by corona discharge. A metal oxide can be provided on a metal substrate, e.g. of the same metal species as the substrate (e.g. $Al/Al_2O_3$) or as the oxide of an alloying element, e.g. chromium oxide on stainless steel or zinc oxide on brass. Alternatively it can be provided on a non-metal substrate (for example a plastics sheet), as will be later described.

The substrate may be a metal sheet provided with a metal oxide or sulphide printing surface which is different from that which would be achieved by oxidation or sulphidation under ambient conditions. For example when the process of producing the substrate employs, for example anodisation, it may produce a metal oxide printing surface which is thicker and/or more durable than would otherwise be the case.

A metal substrate may be both grained and anodised, for example electrochemically grained, and electrochemically anodised.

Preferably the metal compound has an average thickness in the range 0.05 to 20 gsm (grams per square meter), preferably 0.1 to 10 gsm, preferably 0.2 to 6 gsm, preferably 1 to 4 gsm.

The printing surface may preferably be aluminium oxide or titanium oxide.

The printing form may preferably comprise an aluminium or titanium substrate, on which the respective aluminium oxide or titanium oxide printing surface is disposed.

The printing form precursor may be a plastics or plastics-containing sheet (preferably a polyester sheet or a fibre-reinforced plastics sheet, for example glass reinforced plastics (GRP), for example glass-reinforced epoxy resin sheet) onto which the metal compound is applied. This could be by a vapour deposition or sputtering method, by corona discharge, or by any anodising process. To achieve this by anodising the printing surface precursor requires a conductive layer. Conductive polymers are available but in a preferred method a metal layer is applied to the sheet, for example by vapour deposition, by casting, by solution deposition or by lamination. Reference is made to the laminates of aluminium and plastics described in U.S. Pat. No. 5,650,258 for more information as to how to provide such laminates. Whilst such laminates are of interest in the methods of the present invention no claim is made to any such laminates per se. Alternatively the substrate may be steel sheet of a grade and thickness such that it can be bent and flattened multiple times, without cracking or adopting an undesired permanent shape.

A metal substrate may optionally be coated with a protective surface to prevent chemical attack during the precursor manufacture or on the press from any pressroom product which the printing form may contact.

Another suitable substrate, described in WO 2009/059826, may be an aluminium alloy core clad with different aluminium alloy to provide a composite product having good strength, and formability.

One preferred plastics-containing laminate for use in this invention is a polyester/metal oxide laminate, for example a polyester/aluminium/aluminium oxide laminate.

An especially preferred plastics-containing substrate for use in this invention is an epoxy-glass fibreboard (e.g. of the type used as the carrier for copper layers in printed circuit board (PCB) laminates known as FR4). Such materials have a high Young's modulus, for example approximately 25 GPa, much higher than many other plastics sheet materials and within the same order of magnitude as aluminium (whose Young's modulus is 69 GPa).

A preferred metal oxide printing surface of utility in this invention may be anodised and subjected to a post-anodic treatment (PAT). Suitable post-anodic treatments include treatments by, for example, poly(vinylphosphonic acid), inorganic phosphates and fluoride-containing materials such as sodium fluoride and potassium hexafluorozirconate. However embodiments in which the substrate is not subjected to a post-anodic treatment are not excluded.

When we write herein that the metal compound printing surface is uncoated by a developable image layer we mean that it does not carry a layer which is developable imagewise, in a developer liquid. Such a layer typically comprises an organic material, such as a film-forming polymer. It may be said that the metal compound printing surface has no potential for providing energy-induced solubility differential in a developer liquid. Rather, the metal compound printing surface of the present invention may be "switched" by the incident energy between relatively ink-accepting and ink-rejecting states.

The metal compound printing surface provided in step a) is more hydrophobic than that produced in step b) by a degree sufficiently large to produce differentiation in ink-acceptance.

It is well known and accepted that the non-image aluminium oxide printing surface area of grained, anodised, post anodically treated and image layer coated lithographic plates, is strongly hydrophilic, with the image layer being hydrophobic. Indeed, and as has already been indicated, it is this differentiation in ink receptivity between image and non-image areas, which is the basis of the lithographic printing process. It was surprising to find therefore that non-coated lithographic aluminium oxide substrates had a higher water contact angle than had been expected and that the alumina surface was strongly hydrophobic. Also surprisingly, it has been found that exposure of this surface to energy as described in this invention, 'switches' the aluminium oxide substrate from hydrophobic to hydrophilic, effectively introducing a lithographic printing surface which is capable of generating good quality prints. Moreover, the exposed surface over a period of time, returns to a hydrophobic state and can then again be exposed to energy to render exposed areas hydrophilic once more and generate a new lithographic printing surface.

Therefore, for practical purposes the uncoated metal compound printing surface provided in step a) in the present invention is preferably such that it can be regarded as hydrophobic. We do not know why the printing forms of the present invention, whose printing surfaces are uncoated by image layers are, relatively, hydrophobic (there is a hypothesis that the relative hydrophobicity of the metallic compound may be due to atmospheric 'adventitious carbon' but this is not proven). Nor do we understand how they become hydrophilic on imagewise exposure to energy; nor how they subsequently return to the required hydrophobic condition. However such changes do occur and are exploited in the practice of the present invention.

There is some evidence that there are a number of parameters which may (probably independently) affect the time taken for the metallic compound to reach 'first oleophilicity' (this is the point where the metallic compound can be considered hydrophobic from a contact angle perspective).

Preliminary testing has shown that in the case of aluminium/aluminium oxide printing form precursors which are anodised, optionally grained and optionally given a post-anodic treatment, that the time to first oleophilicity (TFO) may be affected, for example, by the degree of anodising (low anodic weight as for example by 'flash' anodising or by corona discharge or higher anodic as in electrochemical anodising), by the presence or absence of electrochemical graining and by the nature and presence or absence of a post anodic treatment.

There are also some preliminary indications that the TFO can be affected by temperature—higher temperatures apparently lead more quickly to hydrophobisation.

With this initial evidence there are strong indications that a 'control measure' can be established to provide a consistent and relatively stable metallic compound surface for the manufacture of the printing plate precursor.

Step a) herein may include using such a control measure to control (preferably accelerate) the onset of the desired hydrophobic condition, when the initially provided surface was hydrophilic. Such a control measure may include a measure taken during any anodising or post-anodic treatment or the provision of a suitable environment; for example a gaseous environment; or the application of heat or other energy.

Steps d) and e) are preferably carried out, but need not be. When they are carried out, the printing form is being re-used. However there may be great benefit even in using the printing form precursor only once, applying only steps a)-c). The printing form precursor, which has a metal compound image layer and no further coating containing an imaging chemistry, is advantageously simple and is expected to be inexpensive.

Optional step d) in which the printing surface becomes less hydrophilic is called "reversal" or "reversing" hereinafter.

Reversal control means may be used to control the reversal, for example the time required for reversal, or the extent of reversal.

We have found that by manipulation of graining and/or anodising and/or post-anodic treatment (operations which, when carried out, may be regarded as being part of step a)) the ease with which a printing form undergoes, in step d) a sufficient reduction in hydrophilicity to be re-used, when this is desired, may be controlled, within a useful operating window. Such manipulation includes one or more of:
  altering the chemistry which is used to achieve graining;
  altering the chemistry which is used to achieve anodising;
  altering the chemistry which is used to achieve post-anodic treatment;
  omitting graining;
  omitting anodising;
  omitting a post-anodic treatment.

A reversing control means may be in the form of a reversing advancing means (which may also be called "reversing promoter" or "reversing accelerator") or a reversing retarding means (which may also be called a "reversing decelerator").

A reversing advancing means may be employed to effect or promote the reversal in hydrophilicity defined in optional step d) of the method of the invention when the surface would otherwise not self-reverse; or when it would self-reverse, but more slowly or less completely than is desired.

A reversing retarding means may be employed to retard the reversal in hydrophilicity defined in optional step d) of the method of the invention, when the surface would otherwise reverse more rapidly than is desired. It is believed that certain gaseous environments may delay the reversal in hydrophilicity defined in step d); for example helium or a helium-rich atmosphere (preferably at least 50% w/w helium, preferably at least 80% w/w helium), or oxygen or an oxygen-rich atmosphere (preferably at least 50% w/w oxygen, preferably at least 80% w/w oxygen) and nitrogen or a nitrogen-rich environment (preferably at least 90% w/w nitrogen). Such gases and blends of such gases may be used to control reversion time; potentially, to retard or shorten it.

Air may give reversal at a practicable speed and may itself be regarded as a reversing control means. References to acceleration or deceleration may be in comparison to air, as a reference.

In optional step d) the printing surface may suitably be exposed to a gas (including air).

Preferably, the printing surface is in a gaseous environment throughout step d), and preferably until step e) is commenced.

Preferably the printing surface is not subjected to a liquid reversion means in optional step d); and preferably not before step e) is commenced. Preferably it is not subjected to any liquid in step d), and preferably not before step e) is commenced.

A reversing control means may be energy; particularly as a reversing advancing means.

In step d), when employed, the printing surface may be caused to undergo a reduction in hydrophilicity with the assistance of by an active step, for example overall chemical treatment or flood exposure to suitable heat or electromagnetic radiation (including heat). In other, passive, or natural or unassisted, embodiments, however, the printing surface is caused to undergo a reduction in hydrophilicity solely by the passage of time, preferably under ambient conditions (in air, ambient temperature e.g. 15-30° C.). Thus such a preferred printing surface may be said to be self-reversing, over a reversion period. Alternatively the change of step d) could involve a combination of an active step and a passive or natural or unassisted reversion period.

For convenience and ease of reading step d) and the invention as a whole will be discussed using the term 'reversal', and derivative terms. This does not mean to say, when steps d) and e) are carried out, that the invention requires precise restoration of the original characteristics of the printing surface. It is enough that there are changes from hydrophobicity, to hydrophilicity, to hydrophobicity, and so on if wished, enabling different images to be carried by, and printed from, the same printing surface. 'Reversal' essentially means that the differentiation caused by the imaging energy substantially disappears, so that what was recently the 'printing form' has of itself now become, once again, a 'printing form precursor', which can be used again.

Suitably the time periods involved in the method of the invention involving re-use—whether the reversal is wholly passive or a combination of active and passive—should be practicable for the printer. Preferably the printing surface remains sufficiently hydrophilic, after step b), for a printer to be able to use it for printing for a period of at least 4 hours, preferably at least 8 hours, more preferably at least 12 hours, measured from the image-forming step b). On the other hand, the printer will wish to re-use it in a new printing operation, after a suitable period, by which time it should have become sufficiently hydrophobic again. This period is preferably not greater than 72 hours, preferably not greater than 48 hours, more preferably not greater than 24 hours, measured from the image-forming step b).

In the method of the invention step e) is preferably repeated, along with steps b) and c).

Suitably steps b), c) and d) can be carried out at least 3 times. Suitably steps b), c) and d) can be carried out up to 20 times, suitably up to 10 times. They may, for example, suitably be carried out 4 or 5 times.

Step b) may involve, in a single stage of operation, delivery of sufficient energy, preferably delivered by a laser, to cause said increase in the hydrophilicity of the printing surface.

Preferably step b) employs an energy source which is digitally controlled.

Alternatively, in step b), energy may be delivered to the printing surface in two or more discrete stages, with the final stage causing the hydrophilicity of the printing surface to reach a desired level, and the previous stage, or stages, preparing the printing surface for that to happen. The previous stage(s), may be regarded as "priming" the surface. Suitably the energy delivered in the final stage is then less than that which would be required if it were the only stage of energy delivery in step b).

Indeed, the first stage(s) of energy delivery within step b) may be carried out as part of the manufacture of the printing form precursor, and puts the printing form precursor in a state of readiness, to be rendered hydrophilic by a relatively low dosage of energy supplied during use, by the printer.

Delivery of the energy in stages, as described above, may assist in achieving the desired change in hydrophilicity whilst minimising the risk of damage, for example irreversible ablative damage, caused by the energy.

Delivery of the energy in stages, as described above, may involve a first delivery of energy in a blanket of flood manner, for example during the printing form precursor manufacture, and a second delivery of energy in an imagewise manner, for example immediately prior to printing. The second delivery of energy may be delivered by a digital source, for example a laser.

In printing, an oxophilic ink applied to the printing form precursor would be able to coat the whole of its hydrophobic surface. Imagewise delivery of suitable energy leading to the creation of hydrophilic regions means that such regions will no longer accept the ink. Instead they preferentially accept the water present in the fountain solution.

Preferably the printing surface of a printing form precursor used in the invention is a substantially uniform surface.

The imaging energy may suitably be visible, ultra-violet or infra-red radiation.

Preferably the imaging energy is delivered in pulses. Preferably the pulses are very short end separated by much longer intervals.

Preferably the imaging energy is delivered by an ultra-short pulse or ultra-fast laser. Preferably the laser emits suitable pulses as such (i.e. is a dedicated pulse generator); preferably it is not a continuous wave laser whose output is modulated post-emission to form "pulses". Preferably it is not a continuous wave (CW) laser whose output is modulated by electronic control of the laser power source. In such cases the power delivered by the "pulse" is no different, or not substantially different, from the power delivered by the non-modulated continuous wave output. In contrast it is preferred that the present invention uses pulses of intense power.

Suitable lasers for use in this invention may operate by Q switching, in which energy is built up to be released as pulses in avalanche events; mode locking, which uses optical interference to produce pulse-shaped "beats" of light; Cavity Dumping, in which a "door" is opened periodically to "dump" a burst of light; and Gain Switching, in which pulses are formed by quickly switching the optical gain in the laser medium used to generate the laser light.

Preferably the imaging energy is delivered in the form of pulses of electromagnetic radiation, preferably from an ultra-fast laser, such pulses being of duration not greater than $1\times10^{-6}$ seconds, preferably not greater than $5\times10^{-7}$ seconds, preferably not greater than $1\times10^{-7}$, preferably not greater than $5\times10^{-8}$, preferably not greater than $1\times10^{-8}$ seconds, preferably not greater than $5\times10^{-9}$ seconds, preferably not greater than $1\times10^{-9}$ seconds, preferably not greater than $5\times10^{-10}$ seconds, preferably not greater than $1\times10^{-10}$ seconds, preferably not greater than $5\times10^{-11}$ seconds, preferably not greater than $1\times10^{-11}$ seconds. In some embodiments they may be of duration not greater than $5\times10^{-12}$ seconds, preferably not greater than $1\times10^{-12}$ seconds, preferably not greater than $1\times10^{-13}$ seconds.

Preferably the pulses of electromagnetic radiation, preferably from an ultra-short pulse or ultra-fast laser, are of duration at least $1\times10^{-18}$ seconds, preferably at least $1\times10^{-16}$ seconds, preferably at least $1\times10^{-15}$ seconds, preferably at least $5\times10^{-15}$ seconds, preferably at least $1\times10^{-14}$ seconds, preferably at least $5\times10^{-14}$ seconds, preferably at least $1\times10^{-13}$ seconds. In some embodiments they may be of duration at least $5\times10^{-13}$ seconds, preferably at least $1\times10^{-12}$ seconds, preferably at least $5\times10^{-12}$ seconds.

One imaging tool suitable for use in the present invention is a femtosecond laser, for example emitting pulses of pulse duration in the range 50-400, for example 100-250, femtoseconds (fs).

Another imaging tool suitable for use in the present invention is a picosecond laser, for example emitting pulses of pulse duration in the range 1-50, for example 5-20, picoseconds (ps).

The pulses could be produced by a generator working at a fixed pulse repetition frequency, or in a region around a fixed pulse repetition frequency. Alternatively the pulses may be generated by a signal derived from the plate processing apparatus. Such a signal could typically have a small variation in pulse repetition frequency, or may have a large range in pulse repetition frequency, in principle being possible at very low rates. In all these cases there can be identified an average frequency of pulsing that would occur over the processing of a whole plate, and possibly a maximum pulse repetition frequency that may depend on the specification of the electromagnetic source or the specification of the plate exposure apparatus (platesetter). The average pulse repetition processing frequency is an important parameter of the production rate of the plate exposure apparatus (platesetter—as later described in more detail).

The average frequency of pulsing is preferably at least 100 pulses per second (100 Hz). Preferably it is at least 1000 pulses per second (1 kHz), preferably at least $10^4$ pulses per second (10 kHz), preferably at least $10^5$ pulses per second (100 kHz), and preferably at least $10^6$ pulses per second (1 MHz). In certain embodiments it could be higher, for example at least $10^7$ pulses per second (10 MHz), or at least $5\times10^7$ pulses per second. These repetition rates are in the range 0.0001 MHz to 50 MHz, or higher, and might be expected to lead to plate production speeds, e.g. within a platesetter, of up to approximately 45 plates per hour.

Preferably the pulsed radiation is applied to an area of less than $1\times10^{-4}$ cm$^2$ (e.g. a 113 µm diameter circle), preferably less than $5\times10^{-5}$ cm$^2$ (e.g. a 80 µm diameter circle), preferably less than $1\times10^{-5}$ cm$^2$ (e.g. a 35 µm diameter circle).

Preferably the pulsed radiation is applied to an area preferably greater than $1\times10^{-7}$ cm$^2$ (e.g. a 3.5 µm diameter circle), preferably greater than $5\times10^{-7}$ cm$^2$ (e.g. a 8 µm diameter circle), preferably greater than $1\times10^{-6}$ cm$^2$ (e.g. a 11 µm diameter circle).

The delivery of the electromagnetic radiation may be even over time but this is not an essential feature of the invention. If the delivery of electromagnetic radiation varies over time, for example using a pulse repetition frequency sweep, definitions of parameters such as pulse duration and pulse separation given herein are to be taken as average values.

A convenient measure of the energy requirement of the process for forming a printing plate is to determine the energy density (energy per unit area) required to achieve the necessary changes in the plate surface. Where the electromagnetic energy is delivered continuously (continuous wave) at a Power, P (Watts) into a defined spot of diameter D (cm) (or for a non circular spot, some measure of the linear extent of that spot, e.g. the side length of a square spot) then the Power Density, i.e. Watts per unit area, is the Power divided by the spot area. It is common practice to ignore any numerical scaling factor for similar spot shapes, i.e. for a circular spot it is common to divide the power by the square of the diameter, $P/D^2$. To get the energy density it is necessary to estimate the time that the spot is exposed for. A simple estimate of this is to take the time that the beam takes to traverse the spot, i.e. the spot diameter divided by the traverse speed, v (cm/s) of the electromagnetic beam. This is D/v. The energy density is the power density multiplied by the exposure time, which is given by the formula P/Dv (J/cm$^2$). This definition for the energy density is commonly referred to as the "Specific Energy" of a continuous wave process.

However this invention preferably uses pulsed radiation. For a pulsed electromagnetic beam the situation is more complicated. The simplest analysis is when each pulse of the source exposes a unique and previously unexposed spot on the surface. Furthermore if the beam is stationary at the arrival and throughout the duration of the pulse, then the energy density can be simply calculated. The beam power during the pulse can be estimated as the energy of the pulse, E (J), divided by the pulse length (s). The Power density is defined as this power divided by the spot area as discussed previously. However the exposure time is now solely the length of the pulse (s) and so the energy density becomes simply the pulse energy divided by the spot area, $E/D^2$. This energy density is commonly referred to as "Fluence" in the literature.

Normally it is not desirable to stop the beam movement to deliver pulses as this introduces delays and does not optimise the throughput of the process. Thus the beam traverses the surface during the extent of the pulse. This can be regarded as elongating the spot in the direction of beam travel by an extent given by multiplying the traverse speed v by the pulse length τ, with the spot area now being defined as D(D+ τv). The formula for fluence, F, becomes:

$$F=E/(D(D+\tau v))=E/D^2(1+\tau v/D)$$

If τv/D<<1 then the effect of traverse speed can be ignored. For a spot size of 20 µm travelling at 1 ms$^{-1}$ and a pulse length of 10 pS then τv/D=$5\times10^{-7}$ so the effect of travel speed on the fluence can be safely ignored.

Another factor is related to pulse overlap. If the speed is sufficiently high for a given frequency then the individual pulses do not overlap on the surface of the material. For this to happen then it is simple to show that $fD/v<1$, where f is the repetition frequency of the pulsed electromagnetic source. When the traverse speed is such that the pulses are not spatially separated then the effect of overlapping pulses on the material surface may have to be considered. It is common in the literature of short pulsed laser processing to refer to the effect of overlapping pulses as "incubation" and to measure the degree of incubation by estimating the number of overlapping pulses, N, as $N=fD/v$. N is sometimes referred to as the incubation number or incubation factor and does not need to be an integer. If $N<1$ there is no overlap of pulses. When $N=1$ (which is preferred) the exposure spots of successive pulses are touching, and as N increases there is increasing overlap of spots. For low values of N, say $N<5$, there may be little influence on incubation. However at high values of N a process may be regarded as a "quasi CW" process, and the energy density may be better expressed in terms of "Specific Energy".

Finally after a substantial area of, or the whole of, a plate has been exposed then an additional pass, or passes may be made. These additional passes may increase or add to the material changes created by previous passes.

When pulse overlap is employed ($N>1$) it is believed that lower energy may be needed than when pulse overlapping is not used ($N=1$). Furthermore it is believed that the reduced pulse energy needed will allow the repetition rate of the pulsed electromagnetic source to be increased by a factor greater than the incubation number N, enabling the process to be faster than the process without overlapping pulses.

The present invention preferably employs a low value of N; thus "fluence", in $mJ/cm^2$, is regarded as the most appropriate definition of energy density, for use in this invention.

Preferably the fluence in the method of the present invention is at least $1$ $mJ/cm^2$, preferably at least $10$ $mJ/cm^2$, preferably at least $30$ $mJ/cm^2$, preferably at least $50$ $mJ/cm^2$, for example at least $100$ $mJ/cm^2$.

Preferably the fluence in the method of the present invention is not greater than $20,000$ $mJ/cm^2$, preferably not greater than $10,000$ $mJ/cm^2$, preferably not greater than $5,000$ $mJ/cm^2$, preferably not greater than $2,000$ $mJ/cm^2$, preferably not greater than $1,000$ $mJ/cm^2$, preferably not greater than $500$ $mJ/cm^2$, preferably not greater than $200$ $mJ/cm^2$. It may be not greater than $100$ $mJ/cm^2$, and in some embodiments not greater than $50$ $mJ/cm^2$.

Preferably the pulse energy delivered in this method is at least $0.1$ $\mu J$, preferably at least $0.5$ $\mu J$, and preferably at least $1$ $\mu J$.

Preferably the pulse energy delivered in this method is up to $50$ $\mu J$, preferably up to $20$ $\mu J$, preferably up to $10$ $\mu J$, and preferably up to $5$ $\mu J$.

Preferably a region to be imaged in the method is subjected to one pass or traverse only, of the beam of electromagnetic imaging energy. However in other embodiments a plurality of passes may be employed, for example up to 10, suitably up to 5, for example 2. In such embodiments the first pulse has a pulse energy as defined above. Subsequent pulse(s) may have a pulse energy as defined above but this need not be the same pulse energy as the first pulse, or any other pulses; for example it may advantageously be less.

When multipass laser imaging is employed, it is intended that passes are made without significant delay between them and without treatments being applied between them (other than, if necessary, debris removal). It is desirable that any such treatments are carried out without removal of the plate from the platesetter. Preferably, however, no such treatments are required and the multipass imaging process is carried out in one stage (as opposed, for example, to two stages separated by a dwell time).

Preferably the method of the invention does not cause ablation; or, if it does, causes only insubstantial ablation; for example ablation at a level which does not require removal of debris between steps b) and d).

The pulse may generate a spot or pixel of any shape, for example circular, oval and rectangular, including square. Rectangular is preferred, as being able to provide full imaging of desired regions, without overlapping and/or missed regions.

The natural profile of a laser beam, by which is suitably meant the energy or intensity, is Gaussian; however other beam profiles are equally suitable to carry out the change described herein, especially laser beams with a square or rectangular profile (i.e. energy or intensity across the laser beam). The cross-sectional profile of the laser beam may be circular, elliptical, square or rectangular and preferably the intensity of the laser beam energy (or "profile" of the laser beam) is substantially uniform across the whole area of the cross-section.

Preferably the method employs, as the imaging device, a laser providing such pulses, for example a femtosecond or picosecond laser. Such lasers provide pulses of high intensity; they are not adapted or gated CW lasers. Alternatively the method may employ, as the imaging device, a nanosecond laser fitted with a device, such as a Q-switch, to release intense pulses of laser energy "stored" during dwell times (in which the laser was still pumped but not releasing the photon energy produced).

Preferably the imaging energy, of whatever type and however delivered, does not produce substantial heat at the impinged-upon surface.

Femtosecond and picosecond lasers are especially preferred.

Ultra-fast fibre lasers may be used, in which a chemically treated ("doped") optical fibre forms the laser cavity. This optical fibre is "pumped" by laser diodes, and there are several proprietary technologies used to couple the pumped light from the laser diodes into the optical fibre. Such lasers have relatively few optical components and are inexpensive, efficient, compact and rugged. They are thus considered to be especially suitable for use in this invention. However other ultra-short pulse or ultra-fast lasers may be used.

A printing precursor of the present invention may be subjected to radiation during its manufacture. For example it may be flood exposed, in order to reduce the energy required to image it in use. Alternatively this could be done by the printer, before first use of the printing form precursor. It may thus be "primed" for use. Once reversion taken place in step d), it may again be flood exposed for the same purpose, by the printer.

The printing form precursor may, in some embodiments be exposed on an imaging device in one imaging step b) and transferred to a printing press, and later returned to the image device for the next (and any successive) imaging step b).

The imaging device may be a platesetter. To get a laser to expose a plate the laser, the plate, or both have to move so that the whole plate surface can be addressed—the process called rastering. The arrangement of the laser within a platesetter (frequently referred to as the 'architecture') can be accomplished in one of three basic ways. Each of these architectures may be used in the present invention, and has its own performance differences, advantages and disadvantages. In the Flat Bed architecture, the plate is mounted flat on a table and the laser scans across, then the table moves down by one pixel and the laser scans back again. In the Internal Drum architecture the plate is fixed into a shell and the imaging laser rotates at high speed in the centre of the drum (in most but not all internal drum setters the plate remains still and the laser moves laterally as well as longitudinally). In the third architecture, External Drum the plate is clamped onto the outside of a cylinder, and the laser (or quite commonly a number of, for example, laser diodes) is mounted on a bar; usually the cylinder rotates and the laser(s) track across the plate.

The printing form precursor may, in some embodiments, be exposed on a printing press.

A method which involves transferring the printing form precursor between an imaging device and a printing press may require a printing form precursor which can be reconfigured between a flat shape (when on the imaging device) and a cylindrical shape (when on the printing press). Such a printing form precursor requires flexibility. Certain of the printing form precursors described above are sufficiently flexible to be reconfigured between flat and cylindrical forms several times, without distortion in its shape or damage to the printing surface. One example is a printing form precursor having a plastics base layer, for example having a polyester layer, for example of average thickness in the range 25 to 250 µm, preferably 100 to 150 µm, and an aluminium oxide layer, for example of average thickness as described above. Between the polyester layer and the aluminium oxide layer there may advantageously be an aluminium layer of average thickness in the range 10 to 50 µm, preferably 20 to 30 µm. Non-metallic (and metallic) substrates having metal oxide layers, or able to carry metal oxide layers, are described in U.S. Pat. No. 5,881,645, U.S. Pat. No. 6,105,500 and WO 98/52769 and they and variations thereof may provide flexible and non-brittle printing form precursors of utility in the present invention.

The printing form precursor may be a flat plate, a plate with a curved surface, for example a roller, e.g. for use on a printing press, or cylinder or sleeve for a cylinder, in each case, suitable for use on a printing press.

In accordance with the present invention the energy applied directly changes (i.e. without the agency of a developer) the characteristics of the printing surface, in a manner which may be exploited in printing. In this invention, which emphasises re-use, the method is preferably not carried out to the point where ablation occurs. Rather, the surface is modified non-catastrophically, so as to permit reversal, and preferably multiple reversals.

The printing form precursors of the present invention are non-organic in character in both image and non-image areas and are therefore unlikely to be susceptible to pressroom chemicals. Accordingly, reduced runlength and image blinding issues are unlikely to be encountered—a distinct advantage for the systems described. In contrast, traditional printing plates, carrying an organic image layer, are susceptible to damage from the printing press washing and cleaning media. In particular if printing inks which harden with UV light are employed, wash-out (or cleaning media) agents are used which have a high content of solvents (such as ethers, esters or ketones) or are even formulated entirely on the basis of organic solvents. These wash-out agents may cause considerable damage to the copying layer causing image 'blinding' (poor or inadequate acceptance of ink) or shorter press runs for example. In addition to the deleterious effects of UV inks on copying images, other pressroom chemicals such as fountain solutions, blanket washes and press washes, all of which may contain significant levels of organic solvents or auxiliaries, such as isopropyl alcohol or surfactants, may also cause short runlength and/or image blinding.

The invention will now be further described, by way of example, with reference to the following.

Unless otherwise stated, the printing form precursor used in these experiments is generated from degreased aluminium treated as follows:

Step 1 electrochemical graining with hydrochloric acid (8-10 gl$^{-1}$ at 30-33° C.)

Step 2 desmutting phosphoric acid (250 gl$^{-1}$ at 35° C.)

Step 3 electrochemical anodising with sulphuric acid (150 gl$^{-1}$ at 30-32° C.).

To provide an aluminium oxide layer having a mean thickness of approximately 2.5 gsm.

Unless otherwise stated, ultra-fast exposures were undertaken using a Clark femtosecond laser of pulse repetition frequency 1 kHz and wavelength 775 nm and using an energy of 6 µJ and a tracking speed of 20 mmsec$^{-1}$.

EXAMPLE SET 1

In this set of experiments the exposure of anodised aluminium sheets to ultra-fast (u-f) laser radiation was examined.

This set of experiments started with freshly prepared aluminium oxide/aluminium substrate, 0.3 mm gauge (degreased, grained roughened, desmutted and anodised, without being post-anodically treated) has a contact angle with water of around 15°. Contact angle means the angle between the surface of a drop of water and the printing surface of the substrate, where the water comes into contact with the printing surface.

When the substrate was allowed to age for four or five days the contact angle increased, until it reached a maximum of around 70°, as shown in Table 1 below. In other words the surface went from hydrophilic to hydrophobic.

TABLE 1

Effect of ageing after production on contact angle of water on an aluminium oxide/aluminium substrate:

| | Time after manufacture | | | | | |
|---|---|---|---|---|---|---|
| | 5 mins | 6 hours | 24 hours | 48 hours | 96 hours | 120 hours |
| Contact angle | 15° | 20° | 30° | 50° | 65° | 70° |

On exposure of an 'aged' (>48 hours), hydrophobic, aluminium oxide/aluminium substrate to an ultra-fast laser beam (Clark ultra-fast laser operating under the following general conditions: wavelength of 775 nm, 30 µm spot size, pulse width 180 fs and with an energy density (fluence) of around 225 mJ/cm$^2$), the contact angle was reduced to ~20° i.e. the exposed area became more hydrophilic. The contact angle then stayed fairly constant for some 12 hours and then started to increase fairly rapidly so that some 16-18 hours after exposure, the contact angle was around 70° once more and the printing surface was once again hydrophobic. This is shown by the results in Table 2 below.

TABLE 2

Effect of time after u-f ("ultra-fast laser") exposure on contact angle of water on an aluminium oxide/aluminium grained and anodised substrate:

| | Time after exposure | | | | | |
|---|---|---|---|---|---|---|
| | 5 mins | 1 hour | 4 hours | 12 hours | 16 hours | 18 hours |
| Contact angle | 20° | 20° | 20° | 30° | 55° | 70° |

In further experimental work re-exposure of the printing surface described above >24 hours after the initial exposure and under laser conditions corresponding to those described above, again brought about a reduction in contact angle (i.e. an increase in hydrophilicity). This effect was observed for at least 5 exposure/re-exposure 'cycles'.

It has been observed that reversion (i.e. to a hydrophobic state) occurs more rapidly the more time a printing surface has been exposed, and further suggests that measures to advance or retard the reversion of the printing form precursor may be feasible.

The results indicate the potential of u-f lasers to provide a 'reversible' or 'rewriteable' printing plate system.

EXAMPLE SET 2

In this set of experiments the contact angle of water with anodised titanium oxide/titanium sheet, and the effect of u-f radiation, was examined.

Anodised (40 $gl^{-1}$ sodium carbonate +2.5 $gl^{-1}$ sodium chloride, 30-32° C.) titanium sheet (having an initial surface layer of titanium oxide), no graining; no post-anodic treatment, had a contact angle with water droplets of around 70°, a day or more after preparation. When exposed to the ultra-fast laser beam under the conditions described in Example Set 1, the contact angle reduced to 15-20° and the surface was rendered hydrophilic. After some 5 hours the contact angle had reverted back to 70°. The results are set out in Table 3 below.

TABLE 3

Effect of time after exposure on contact angle of anodised titanium oxide/titanium sheet:

| | Time after exposure | | | | | |
|---|---|---|---|---|---|---|
| | 5 mins | 1 hour | 2 hours | 3 hours | 4 hours | 5 hours |
| Contact angle | 10° | 10° | 20° | 30° | 55° | 70° |

Comment:

Thus the findings set out in Example Set 1 and Example Set 2, of the change in contact angle on the aluminium and titanium oxide surfaces is of significance for printing plates. The low levels of power required to produce the changes in contact angle—albeit with ultra-fast lasers where the peak energy delivery is extremely high—and the accuracy and simplicity of the method using a u-f laser, show the capability for industrial application, and commercial value. The reversibility offers a prospective environmental and commercial advantage.

EXAMPLE SET 3

Freshly degreased, non-grained and non-anodised aluminium oxide/aluminium is essentially hydrophilic and it has not been possible with ultra-fast laser exposure to introduce a change in hydrophilicity on the scale of hydrophobic to hydrophilic change observed with (several days old) grained and anodised material as described above. Nor is there any evidence with non-grained and non-anodised aluminium of any reversal phenomenon as described above. To check (i) if both graining and anodising are beneficial in effecting the changes in hydrophilicity and (ii) if they play a part in the reversal process, as described above, a series of experiments was carried out, under the conditions described in Example Sets 1 and 2, and with a substrate further described in Table 4 below. The results are recorded in Table 4 below.

TABLE 4

Reversion of alternatively prepared aluminium oxide/aluminium substrates:

| Substrate | Contact angle prior to exposure | Exposure energy (μJ) | Contact angle after exposure | Reversion time (hours)* |
|---|---|---|---|---|
| Grained only | 70° | 2 | 70° | — |
| hydrochloric | 70° | 3 | 50° | — |
| acid (8-10 $gl^{-1}$ | 70° | 4 | 20° | 3 |
| at 30-33° C.) | 70° | 6 | 20° | 9 |
| Anodised | 70° | 2 | 70° | — |
| only | 70° | 3 | 50° | — |
| sulphuric | 70° | 4 | 40° | 8 |
| acid (150 $gl^{-1}$ | 70° | 6 | 20° | >10 |
| at 30-32° C.) | | | | |
| Both grained | 70° | 2 | 70° | — |
| and | 70° | 3 | 50° | 5 |
| anodised | 70° | 4 | 20° | >12 |
| (above conditions) | 70° | 6 | 20° | >14 |

*reversion time is defined as the time taken to revert to the original condition of hydrophobicity as determined by contact angle From the above tabulated results, it is apparent that, whilst hydrophilisation is achieved on an anodised only substrate, and reversion occurs, interesting results are obtained using a grained-only substrate; and that a combination of both graining and anodising is additionally beneficial in extending the reversion time. Also it is of interest to note the energy requirement to achieve the hydrophobic to hydrophilic switch. There is a preliminary indication that if the amount of energy delivered is just sufficient to achieve the 'switch' from hydrophobic (contact angle 70°) to hydrophilic (contact angle 20°), the reversion time (to hydrophobic) is less than if an 'excess' of energy is delivered. This is an indication of one method of controlling the reversion time.

EXAMPLE SET 4

Further work has been undertaken to show that reversion times can be adjusted by the choice of substrate. A series of experiments was carried out as described in Example Sets 1, 2 and 3 above, and as further set forth in Table 5 below. Results are also set out in Table 5 below.

TABLE 5

Reversion times achieved by different aluminium oxide/aluminium substrates:

| Substrate | Contact angle prior to exposure | Exposure energy (µJ) | Contact angle after exposure | Contact angle after 10 hrs | Contact angle after 24 hrs | Contact angle after 72 hrs |
|---|---|---|---|---|---|---|
| Grained and H₂SO₄ anodised (as per general conditions) | 70° | 6 | 20° | 70° | 70° | 70° |
| As above + K₂ZrF₆PAT (4.5 gl⁻¹, 46° C.) | 70° | 6 | 20° | 20° | 35° | 70° |
| Grained and H₃PO₄ anodised (250 gl⁻¹, 30-32° C.) + K₂ZrF₆PAT | 70° | 6 | 20° | 30° | 30° | 30° |

It may be noted that with the PAT (post-anodic treatment), imaged areas remain hydrophilic sufficiently long (up to 24 hours) to enable printing. This is not necessarily the case for non-PAT material. Similarly note that phosphoric acid anodised material the reversion time is further extended (up to 72 hours). These results confirm that it should be possible to 'adjust' reversion times by selection of the substrate in order to meet the printer's needs.

Reversion times also appear to change depending on whether or not the exposure is the first exposure or a subsequent (or re-writing exposure). Reversion times following exposures subsequent to the first appear to get shorter. The opportunity to have the means to 'adjust' the reversion time by substrate choice therefore becomes available and this is potentially very useful from a commercial perspective. For example, it will be seen below that sulphuric acid anodising reversion times differ from phosphoric acid anodising reversion times and non-post anodically treated substrate reversion times differ from post anodically treated substrate reversion times. This preliminary study indicates that it should be possible to adjust reversion time to suit the needs of the printer.

The effect of a post anodic treatment is also evidenced by the results shown in Table 6 below.

TABLE 6

Contact angle measurements for PAT/non-PAT aluminium oxide/aluminium substrates:

| Time after ultra-fast exposure | No post anodic treatment Unexposed | No post anodic treatment Exposed at 6 µJ | Post anodic treatment K₂ZrF₆ PAT (4.5 gl⁻¹, 46° C.) unexposed | Post anodic treatment K₂ZrF₆ PAT (4.5 gl⁻¹, 46° C.) Exposed at 6 µJ |
|---|---|---|---|---|
| Before exp | 75° | 20° | 75° | 20° |
| 1 hour | — | 30° | — | 20° |
| 2 hours | — | 70° | — | 20° |
| 5 hours | — | 75° | — | 20° |
| 7 hours | — | 75° | — | 20° |
| 9 hours | — | 75° | — | 40° |
| 18 hours | — | 75° | — | 60° |

The substrates were grained, desmutted and anodised as described above. The results are of the initial exposure of the substrates to imaging radiation.

TABLE 7

Reversion times

| Substrate | Contact angle prior to exposures 1 and 3 | Exposure energy (µJ) Each exposure | Contact angle after 1ˢᵗ exposure | Time to >70° | Contact angle after 3ʳᵈ exposure | Time to >70° |
|---|---|---|---|---|---|---|
| Grained and H₂SO₄ anodised (conditions as above) | 70° | 6 | 20° | ~10 hours | 20° | ~1.5 hours |

The effect on reversion times of subsequent (to the initial) exposures of the same substrates can be illustrated by the results in the following Table 7.

It is evident from the data in the table above, that the reversion time for the first exposure which is of the order of 10 hours, is significantly longer than a third exposure where the reversion time drops to approximately 1½ hours. These results suggest that the use of modifiers, such as post-anodic treatments and phosphonic acid anodising may be useful in controlling reversion time.

EXAMPLES SET 5

Exposure energy requirements were investigated to study obtaining the desired change in hydrophilicity without damaging the ultra-fast-exposed surface.

Figure 2:
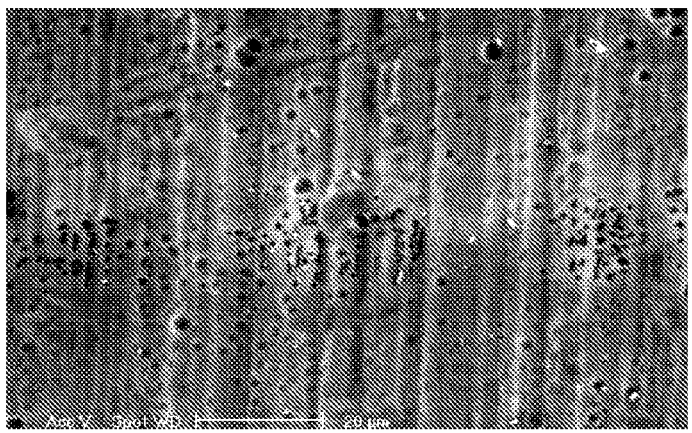

Surface characterisation and weight loss studies of aluminium oxide/aluminium samples as described have indicated that at an exposure energy of about 4 µJ and a tracking speed of 15-20 mmsec⁻¹, a change from hydrophobic to hydrophilic can be effected with minimal anodic layer damage as evidenced by the SEM micrographs of FIGS. 1 and 2, and separately, contact angle measurements.

In the SEM image of FIG. 1, it is apparent that the 2×5 µJ pulses cause some disruption to the anodic layer which is not evident in SEM image FIG. 2 where the ultra-fast exposure was 2×4 µJ pulses. Surface areas imaged with energies equivalent to the SEM image of FIG. 2 are rendered hydrophilic as determined by contact angle measurements.

Possible Importance of 'Flat Top' Beam Profile

To establish best utilisation of the exposure energy of the ultra-fast laser beam and yet minimise anodic layer (or any surface) damage, it is believed that the ideal profile of the exposure beam, considered as an energy—time graph, would be a 'top-hat' or 'flat-top' profile. It is highly likely with a 'conventional' Gaussian beam profile that that proportion of the beam energy which constitutes the peak energy could damage the anodic layer whereas the remainder of the beam does not. It is expected therefore that a beam which has a more even energy distribution, for example, a beam with a 'flat-top' profile, could be controlled more effectively to deliver hydrophilicity on exposure without causing significant damage to the anodic surface. Preliminary results indicate that this is indeed the case for a Gaussian beam whose profile has been modified by appropriately designed software.

Possible Importance of Ultra-Fast Laser Wavelength

Similarly, consideration has been given to the possibility that the wavelength of the incident ultra-fast laser radiation may be important with respect to the best utilisation of its energy. In effect it may be possible to identify a particular wavelength of incident radiation which maximises the hydrophilisation effect with minimal damage to the anodic layer (or surface layer) at a minimum energy. With this in mind, studies have been conducted on a HiQ picosecond ultra-fast laser under the following general conditions:

Test sample: grained and anodised aluminium ('standard' conditions), no post-anodic treatment
Pulse width: 10 picoseconds
Pulse energy: 2 to 8 µJ
Frequency range: 5 kHz to 20 kHz
Spot size: 22 µm
Tracking speed: 100 to 400 mm/sec
Wavelength: 532 nm (green visible) and 1064 nm (infra-red)

TABLE 8

Potential effect of ultra-fast radiation wavelength

| Wave-length (nm) | Pulse Frequency = 5 kHz Tracking speed = 100 mm/sec | | Pulse Frequency = 10 kHz Tracking speed = 200 mm/sec | | Pulse Frequency = 20 kHz Tracking speed = 400 mm/sec | |
|---|---|---|---|---|---|---|
| | Energy (µJ) | Contact angle (°) | Energy (µJ) | Contact angle (°) | Energy (µJ) | Contact angle (°) |
| 532 | 2, 3, 4 | >70 | 2, 3, 4 | >70 | 2, 3, 4 | >70 |
| 1064 | 2, 3, 4 | >70 | 2, 3, 4 | | 2, 3, 4 | >70 |
| 532 | 5 | 17 | 5 | 28 | 5 | 63 |
| 1064 | 5 | >70 | — | | 5 | >70 |
| 532 | 6 | <10 | 6 | <10 | 6 | 14 |
| 1064 | 6 | >70 | — | — | 6 | 50 |
| 532 | 7 | <10 | 7 | <10 | 7 | <10 |
| 1064 | 7 | — | — | — | — | — |
| 532 | 8 | <10 | 8 | <10 | 8 | <10 |
| 1064 | 8.8 | <20 | 8 | 45 | — | — |
| 532 | — | — | — | — | — | — |
| 1064 | 9.6 | <10 | 10 | <10 | 10 | <10 |

It is evident from the results tabulated above, that with the picosecond laser operating at 532 nm (green), the minimum energy to effect hydrophilisation is around a pulse energy of 6 µJ for each of the frequencies studied. However, for a similar set of pulse repetition frequencies but with the laser operating at 1064 nm (infra-red), a minimum pulse energy of ~8 µJ operating at a frequency of 5 Hz (and a tracking speed of 100 mm/sec), is required.

These results strongly suggest that there is some wavelength dependency for ultra-fast laser exposure with respect to introducing hydrophilicity into the printing form precursor as herein described. This dependency may well offer a means to effect hydrophilicity whilst simultaneously minimising unwanted surface defects (such as destruction or partial removal of the anodic layer).

Possibility to 'Prime' the Surface

Further experimental work has shown that single pulse exposures at energies (say <or=3 µJ) which are below those causing anodic layer damage, as evidenced by scanning electron microscopy, may subsequently be rendered hydrophilic by a second 'low' energy exposure; again in this way anodic layer damage is minimised. This gives rise to the idea of using a low energy 'blanket' exposure (for example, ultra-fast laser exposure or 'plasma' exposure), prior to low energy, imagewise exposure.

EXAMPLE SET 6

There has been some evidence during the course of the experimental work that different exposure energies (i.e. different from the initial exposure) may be required to render an exposed area hydrophilic for second and subsequent exposures. This may be important when considering this new technology as the source of a re-useable and re-writeable printing plate. It may be that minimised exposure energy may facilitate a greater number of re-exposures as it is possible that surface damage to the alumina may, in this way, be minimised.

General Exposure Conditions

The grained and anodised (standard conditions set out above, no PAT) aluminium oxide/aluminium sheet was exposed to ultra-fast radiation using a Clark femtosecond laser operating as follows: pulse repetition frequency 1 kHz, wavelength 775 nm, a tracking speed of 20 mmsec$^{-1}$ spot size 30 µm, and an exposure energy of 4-6 µJ per pulse.

$1^{st}$ exposure conditions: pulse repetition frequency 1 kHz, a tracking speed of 20 mmsec$^{-1}$, exposure energy 6 µJ.

After the exposure the contact angle for the exposed area was measured and was found to be <10° i.e. the imaged area was completely hydrophilic. The plate sample was left in ambient conditions for 3 days during which time the imaged area reverted to fully hydrophobic i.e. the contact angle >70°.

$2^{nd}$ Exposure Conditions

The second exposure conditions were varied to study their effects.

Sample 1

For sample 1, the exposure energy was reduced to 4 µJ, all other parameters were kept the same as for the $1^{st}$ exposure condition. On exposure the imaged area became hydrophilic with contact angle <10°.

Sample 2

For sample 2, the tracking speed was increased to 30 mmsec$^{-1}$, all other parameters were kept the same as for the $1^{st}$ exposure condition. On exposure the imaged area became hydrophilic with contact angle <10°.

Sample 3

For sample 3, the tracking speed was increased to 30 mmsec$^{-1}$ and the exposure energy was reduced to 4 µJ, other parameters were kept the same as for the $1^{st}$ exposure condition. On exposure the imaged area became hydrophilic with contact angle ~12°.

Conclusions

The above results suggest that imagewise exposures subsequent to the initial exposure may require less incident radiation to effect a change from hydrophobic to hydrophilic. This may be brought about by, for example, adjusting (reducing) the exposure energy whilst maintaining tracking speed of by maintaining the exposure energy whilst increasing the tracking speed. These are important observations and may facilitate a potential increase in the number of image-print-reimage-reprint cycles as printing plate surface damage should be minimised.

EXAMPLE SET 7

Press Testing of a Once, Twice and Three Times Exposed Printing Form Precursor

An electrochemically grained (hydrochloric acid), electrochemically anodised (sulphuric acid) and post-anodically treated (potassium hexafluorozirconate) aluminium oxide/aluminium sheet was allowed to reach its equilibrium point in terms of its hydrophilicity (contact angle ~70° and effectively hydrophobic).

The thus prepared printing form precursor was then imagewise exposed with an ultra-fast laser using the following conditions: femtosecond laser of pulse repetition frequency 1 kHz and wavelength 775 nm, a spot size of 30 µm, a pulse energy of 6 µJ and a tracking speed of 20 mmsec$^{-1}$. The imaged plate was then mounted on a printing press without further treatment and a number of good copies printed to demonstrate a printing capability.

Once the print test was completed, the plate was removed from the press and the printing ink removed using a proprietary plate cleaner. The plate was then allowed to equilibrate (effectively image areas were allowed to return to their hydrophobic state) before the plate was exposed for a second time utilising conditions equivalent to the first exposure. The plate was again mounted on the press and a good image was printed. The initial (first) image had completely reverted to its hydrophobic state and behaved (in printing terms) equivalently to other non-image areas.

The entire process of removing the plate from the press, removing the ink from the plate and allowing to equilibrate was repeated for a second time. The plate was then given a third exposure identical to the first, mounted on the press and printed. A similar result to the second imaging was obtained—good prints were again obtained. Previously exposed areas again behaved (in printing terms) equivalently to other non-image areas.

The print tests demonstrate the capability of the discovered technology to provide a re-writeable and re-useable process less printing plate.

EXAMPLE SET 8

As a possible means to 'retard' or delay the reversion of exposed images (hydrophilic) to hydrophobic, the effects of different gaseous environments have been studied.

Effect of Oxygen, Nitrogen and Helium on Reversion Time

Immediately after image exposure (as described in Example 1) two samples (as described in Example 1) were sealed in separate plastic bags filled with oxygen, two in separate bags filled with nitrogen, three in separate bags filled with helium and one in a bag with no added gas. The three helium bags were then sealed in a large plastic bag also filled with helium. This was done to eliminate concerns about the possible excessive diffusion of helium from its sealed environment.

The sample not under special gas (i.e. in air) was tested 12 hours after image exposure (contact angle 20°) and then again after 20 hours by which time the contact angle was 70°. At this time one sample from each of the three test gas atmospheres was removed from its gaseous test environment and its contact angle measured. All test samples had maintained a contact angle of <10°.

After 34 hours, however, the contact angles of the three test gas samples were re-measured and the contact angles were now found to be 70° i.e. the test samples had reverted to a hydrophobic condition.

The second test gas samples which had continuously been held in oxygen, nitrogen and helium (2 samples in the case of helium) were then tested—the contact angles of the two helium samples had increased to 65°, but the "fresh" oxygen and nitrogen samples still had contact angles of <10°. However, by the time of the next tests some ~48 hours after initial exposure, contact angles of 70° were obtained for both oxygen and nitrogen i.e. these test samples had fully reverted.

Conclusions

All three gases—oxygen, nitrogen and helium—slowed reversion delaying the return to the hydrophobic condition by some 14 hours; oxygen and nitrogen appeared to be marginally more effective than helium. However, despite the possibly limited efficacy of this approach, the results do suggest that there are likely to be means available to retard the reversion to a hydrophobic condition for printing form precursors.

EXAMPLE SET 9

As a possible means to establish a route to ensuring a consistent time to first oleophilicity for the printing form precursor, a number of substrate parameters were studied, as set out below.

Effects of Substrate Variants on Time to First Oleophilicity as Determined by Contact Angle Measurements The contact angles of different substrates at different times after manufacture are set out in Table 9 below General Aluminium Treatment Conditions:
degreasing sodium hydroxide 8-10 gl$^{-1}$ at 35-45° C.
graining hydrochloric acid 8-10 gl$^{-1}$ at 30-33° C.
desmutting phosphoric acid 250 gl$^{-1}$ at 35° C.
anodising sulphuric acid 150 gl$^{-1}$ at 30-32° C.

| Description of aluminium | Printing form precursor - time after manufacture | | | | | | | | | | |
|---|---|---|---|---|---|---|---|---|---|---|---|
| | 0 hrs | 24 hrs | 48 hrs | 90 hrs | 114 hrs | 138 hrs | 162 hrs | 184 hrs | 220 hrs | 244 hrs | 298 hrs |
| Degreased, grained, desmutted only | <20° | 35° | 70° | 70° | — | — | — | — | — | — | — |
| Flash anodised | <20° | 20° | 70° | 70° | — | — | — | — | — | — | — |
| Corona treated | <20° | <20° | <20° | 70°* | 70° | | | | | | |
| Degreased, grained, desmutted, anodised and sealed§ | <20° | <20° | <20° | 20° | 20° | 20° | 20° | 25 | 45° | 45° | 50° |
| Degreased, grained, desmutted, anodised, Na silicate PAT | <20° | <20° | <20° | <20° | <20° | <20° | <20° | <20° | <20° | <20° | <20° |

-continued

| Description of aluminium | \multicolumn{11}{c}{Printing form precursor - time after manufacture} | | | | | | | | | | |
|---|---|---|---|---|---|---|---|---|---|---|---|
| | 0 hrs | 24 hrs | 48 hrs | 90 hrs | 114 hrs | 138 hrs | 162 hrs | 184 hrs | 220 hrs | 244 hrs | 298 hrs |
| Degreased, grained, desmutted, anodised, Na phosphate PAT | <20° | <20° | <20° | <20° | <20° | <20° | <20° | <20° | 45° | 45° | 50° |
| Degreased, grained, desmutted, anodised, Na phosphate + NaF PAT | <20° | <20° | <20° | <20° | <20° | <20° | <20° | <20° | 45° | 45° | 50° |
| Degreased, grained, desmutted, anodised, no PAT | <20° | 20° | 20° | 50° | 50° | 70° | 70° | — | — | — | — |
| Degreased only, no other treatment | 20° | 20° | 20° | 30° | 40° | 40° | 45° | 50° | 50° | 50° | 50° |

*This result was 72 hours after corona treatment
§Sealing was achieved by treating grained, anodised aluminium (no PAT) in boiling water for 10 minutes.

Conclusions

As is evidenced by the above results, for the post anodic treatments (PAT's), sodium silicate has still not even started to become oxophilic some 2 weeks after manufacture whereas sodium phosphate ($NaH_2PO_4$) both with and without sodium fluoride took more than 200 hours to reach a contact angle of >45°; the sealed (boiling water) sample was almost identical. A non-post anodically treated control took some 100 hours to reach a similar state.

Both 'flash' anodising (raising voltage during electrochemical treatment from zero to 12 volts over 5 seconds with good agitation) and corona discharge gave similar results, taking 48 and 72 hours respectively. These results were similar to the ~48 hours taken for the non-anodised control but significantly less than the 130 hours taken for the electrochemically anodised material.

These results again suggest that there should be means available from a commercial perspective to control the time taken to reach the initial hydrophobicity (oleophilicity) and hence provide a printing plate precursors which have consistent starting properties.

EXAMPLE SET 10

To further investigate the potential for the 'multiple' exposure and 'multiple' printing of an ultra-fast exposed aluminium plate, the following experiment was conducted. A grained and anodised aluminium plate ('standard' treatments as identified above) was exposed (exposure 1) using an ultra-fast laser (Clark ultra-fast laser operating under the following general conditions: frequency of 1 kHz, 50 μm spot size, pulse width 240 femtoseconds and fluence of 225 mJ/cm$^2$). The exposure target image comprised two '50% tint' chequers and a non-printing image 'moat' around the chequer patterns (this, to prevent the oxophilic surrounding areas 'swamping' the non-printing image areas and masking any print differential). A simple offset press test (print test 1) was conducted on this as-imaged plate on a Heidelberg GTO press. Print testing took place within two and a half hours of the ultra-fast laser exposure being completed. After adjustment of ink water balance, 250 good quality prints were obtained, before printing was terminated.

Figure 3:
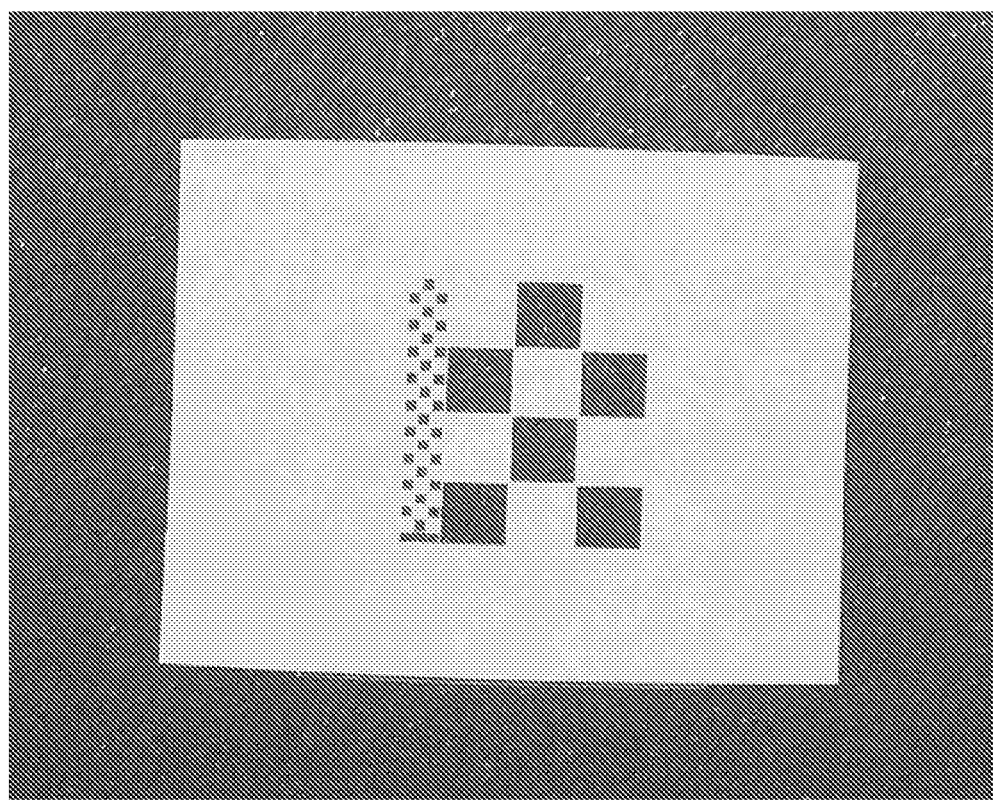

The plate was then removed from the press, excess ink was removed from the plate and the plate was 'reverted' artificially to its hydrophobic state by heating at 150° C. for one hour followed by a 'relaxation' period of 30 minutes under ambient conditions. The plate was then subjected to the same exposure conditions (exposure 2) as in exposure 1 above and again placed on the printing press. After ink water balance adjustments, good quality prints (print test 2) were again obtained. FIG. 3 is a photograph showing the print quality after 250 prints (from print test 2). It is clear from the photograph that the printed image is of good quality and that the print does not show any evidence of the original (first) exposure; suggesting that the first exposure image completely reverted to its original hydrophobic state, and that re-use as a printing plate—involving re-exposure of a further image and a consequential stage of printing that further image—is entirely possible by way of this invention.

EXAMPLE SET 11

Experiments were conducted with a nanosecond pulse laser to see if the same phenomenon was also apparent at longer laser radiation pulses (nanoseconds).

Tests on a pulsed 10 W Ytterbium fibre nanosecond laser (IPG Photonics) using a Pryor (Yb) Pulsed Fibre Laser YF20 system were conducted. General exposure conditions were as follows:

Average power=10-20 W
Frequency=20-100 kHz
Wavelength=1064 nm
Spot size=60μ
Pulse width=100 nanoseconds
Pulse energy=1 mJ The exposure tests were undertaken on grained and anodised aluminium ('standard' conditions, no post-anodic treatment). Contact angle and reversion times are detailed below.

| Pulse frequency (kHz) | Contact angle (°) | | | |
|---|---|---|---|---|
| | On exposure | After 2 hours | After 4 hours | After 9 hours |
| 46 | <15 | 20 | 20 | >70 |
| 60 | <15 | 40 | 70 | >70 |

It was observed that on nanosecond exposure the substrate, in exposed areas, became hydrophilic (as determined by contact angle measurement) and then over a period of time and dependent upon the pulse frequency, the exposed areas of substrate reverted to their hydrophobic state. The observations made, suggest that nanosecond laser exposure of alumina substrate could form the basis for generating a lithographic printing surface.

EXAMPLE SET 12

Simple experiments with stainless steel (grade 304-18% Cr, 8% Ni) have shown that its typically hydrophobic surface (contact angle ~70°) can be rendered hydrophilic (contact angle ~15°) by exposure with a nanosecond laser (Pryor (Yb) Pulsed Fibre Laser YF20) which operates at a wavelength of 1064 nm and an average power of 20 W. The specific exposure conditions employed were as follows: pulse width 100 nS, pulse energy 1 mJ, spot size 60μ and a frequency of 20 kHz. The thus-exposed surface then, over a period of time (4 to 5 hours), reverted to a hydrophobic state (contact angle ~70°). Subsequent re-exposure to investigate if a potential 're-writeable' capability also exists for stainless steel was carried out. Re-exposure with for example, a Clark femtosecond laser operating under the following conditions: wavelength of 775 nm, 30 μm spot size, pulse width 180 fs, resulted in a hydrophilic surface again being generated (contact angle <20°). 'Re-writeability' (and hence re-use as a printing plate) with stainless steel thus appears to be viable.

In this case the image layer is believed to be chromium oxide which naturally forms a passive protective layer on the surface of the stainless steel.

EXAMPLE SET 13

A number of other metals (metallic compounds) have been examined in preliminary tests. The following general ultra-fast laser conditions were employed: HiQ picosecond laser operating at a wavelength of 355 nm, a pulse width of 10 ps, a pulse energy of 7 μJ, a spot size of 15μ and a frequency of 5 kHz. All metallic samples were hydrophobic prior to exposure.

Initial exposures were undertaken, observations made and recorded in the table below. Following the initial exposures, the samples were artificially 'reverted' to their hydrophobic state by heating for 1 hour at 150° C. followed by a 'relaxation' period of 30 minutes under ambient conditions before a second exposure was undertaken. The observations are recorded below.

| Metal/metal oxide | Observation on initial Exposure - hydrophilic? | Observation on re-exposure (after reversion) - hydrophilic? |
|---|---|---|
| Copper (has copper oxide surface) | yes | yes |
| Brass (has zinc oxide surface) | yes | yes |
| Silver (tarnished - thought to be silver sulphide surface) | yes | yes |

The invention claimed is:

1. A method of printing comprising:
   a) providing a printing form precursor having an aluminium oxide printing surface, uncoated by a developable image layer and uniform in its acceptance of an oleophilic printing ink;
   b) subjecting the printing surface imagewise to energy in the form of pulses of electromagnetic radiation of duration not greater than $1 \times 10^{-10}$ second, so as to increase the hydrophilicity of the printing surface, where subjected to energy, sufficient to make the surface differentiated in its acceptance and non-acceptance of the ink; and
   c) applying the ink to the printing surface and printing from the printing surface.

2. A method as claimed in claim 1, wherein step c) is followed by steps of
   d) causing or allowing the printing surface to undergo a reduction in hydrophilicity sufficient again to make the printing surface uniform in its acceptance of a printing ink; and
   e) repeating at least steps b) and c).

3. A method as claimed in claim 1, wherein the printing surface is anodized.

4. A method as claimed in claim 1, wherein the printing form precursor comprises the aluminium oxide printing surface on a metal base layer.

5. A method as claimed in claim 1, wherein the printing form precursor comprises the aluminium oxide printing surface on a plastics base layer.

6. A method as claimed in claim 1, wherein the printing surface is caused to undergo a reduction in hydrophilicity by the passage of time, under ambient conditions.

7. A method as claimed in claim 2, wherein the reduction in hydrophilicity in step d) is controlled wholly or in part by an external agency preferably selected from a surface treatment carried out in step a) or by being subjected to energy and/or a gaseous environment in step d).

8. A method as claimed in claim 1, wherein the printing surface remains sufficiently hydrophilic, after step b), for a printer to be able to use it for printing for a period of at least 4 hours and not greater than 72 hours, measured from the image-forming step b).

9. A method as claimed in claim 2, wherein step d) is repeated, along with steps b) and c); wherein each of steps b), c) and d) are carried out at least 3 times.

10. A method as claimed in claim 1, wherein step b) involves, in a single stage of operation, delivery of sufficient energy to cause said increase in the hydrophilicity of the printing surface.

11. A method as claimed in claim 1, wherein in step b) energy is delivered to the printing surface in two or more discrete stages, with the final stage causing the hydrophilicity of the printing surface to reach a desired level, and the previous stage, or stages, preparing the printing surface for that to happen.

12. A method as claimed in claim 1, wherein the pulses of electromagnetic radiation have a duration of at least $1\times10^{-18}$ second, and are delivered by a laser.

13. A method as claimed in claim 12, wherein the average frequency of the pulses is at least 100 pulses per second.

14. A method as claimed in claim 12, wherein the fluence is at least 1 mJ/cm$^2$ and does not exceed 20,000 mJ/cm$^2$ and the incubation number N is 1 or a larger number up to 10.

15. A method as claimed in claim 12, including subjecting an area of the printing surface to energy from two successive pulses from a pulsed energy beam.

16. A method as claimed in claim 12 including traversing a pulsed energy beam across the printing surface at a speed (v) determined according to one or more of the pulse repetition frequency (f) and the diameter (D) of the beam.

17. A method as claimed in claim 12, wherein the energy per pulse delivered in the method is between 0.1 µJ and 50 µJ.

18. The method of claim 17, wherein the energy per pulse is at least one of the following: between 0.1 µJ and 20 µJ, between 0.1 µJ and 10 µJ, between 0.1 µJ and 5 µJ, between 0.5 µJ and 50 µJ, between 0.5 µJ and 20 µJ, between 0.5 µJ and 5 µJ, between 1 µJ and 50 µJ, between 1 µJ and 20 µJ, or between 1 µJ and 5 µJ.

* * * * *